United States Patent
Ohtsuka et al.

(10) Patent No.: US 7,507,659 B2
(45) Date of Patent: Mar. 24, 2009

(54) FABRICATION PROCESS OF A SEMICONDUCTOR DEVICE

(75) Inventors: Nobuyuki Ohtsuka, Kawasaki (JP);
Noriyoshi Shimizu, Kawasaki (JP);
Yoshiyuki Nakao, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/939,064

(22) Filed: Nov. 13, 2007

(65) Prior Publication Data

US 2008/0113506 A1 May 15, 2008

(30) Foreign Application Priority Data

Nov. 13, 2006 (JP) ............................. 2006-307050

(51) Int. Cl.
*H01L 21/4763* (2006.01)
(52) U.S. Cl. .................. 438/643; 438/687; 257/E21.49
(58) Field of Classification Search .................. 438/627, 438/643, 687
See application file for complete search history.

(56) References Cited

U.S. PATENT DOCUMENTS 6,664,179 B2  12/2003  Akbar et al.

2005/0218519 A1  10/2005  Koike et al.

FOREIGN PATENT DOCUMENTS

| JP | 262035 A | 3/1990 |
|---|---|---|
| JP | 2003218198 A | 7/2003 |
| JP | 2005277390 A | 10/2005 |

OTHER PUBLICATIONS

W.A. Lanford et al.; "Low-temperature passivation of copper by doping with Al or Mg"; Thin Solid Films, 262 (1995), pp. 234-241.
T. Usui et al.; "Low Resistive and Highly Reliable Cu Dual-Damascene Interconnect Technology Using Self-Formed MnSixOy Barrier Layer"; IITC 2005, Session 9.2 (Jun. 6-8, 2005).

*Primary Examiner*—W. David Coleman
(74) *Attorney, Agent, or Firm*—Westerman, Hattori, Daniels & Adrian, LLP.

(57) ABSTRACT

A method for fabricating a semiconductor device has forming an opening defined by an inner wall surface in an insulation film, covering said inner wall surface with a Cu—Mn alloy layer, depositing a first Cu layer over said Cu—Mn alloy layer without exposing said Cu—Mn alloy layer to the air, depositing a second Cu layer over said first Cu layer and filling said opening with said second Cu layer, and forming a barrier layer over said inner wall surface as a result of a reaction between Mn in said Cu—Mn alloy layer and said insulation film.

12 Claims, 13 Drawing Sheets

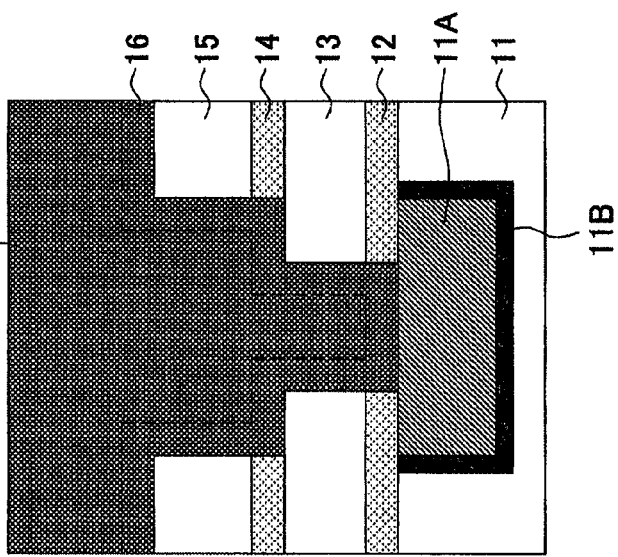
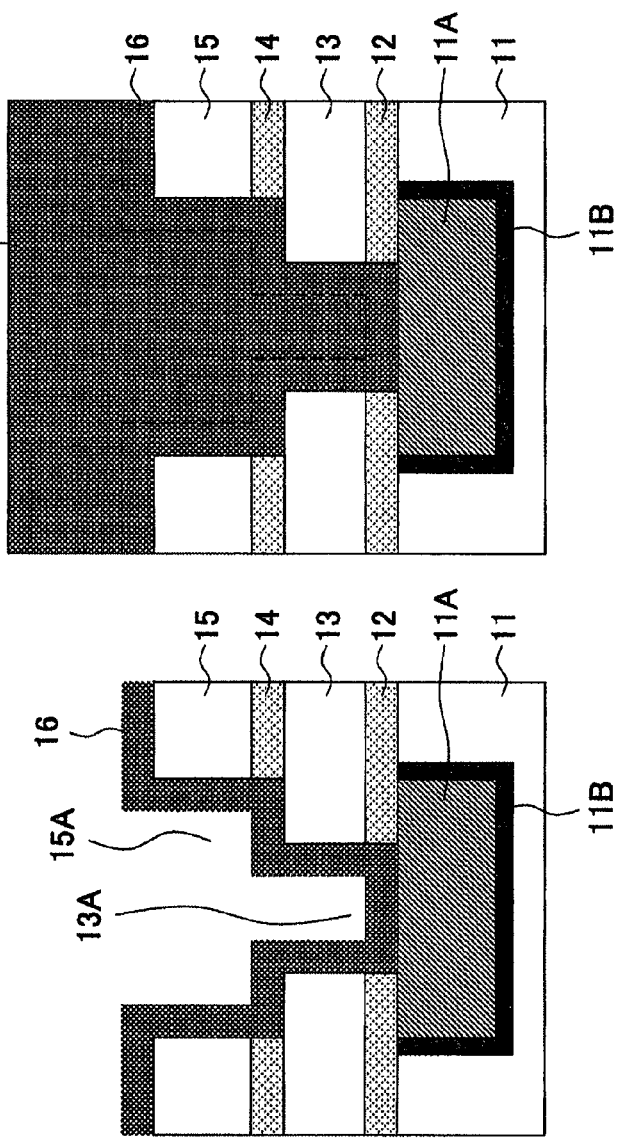
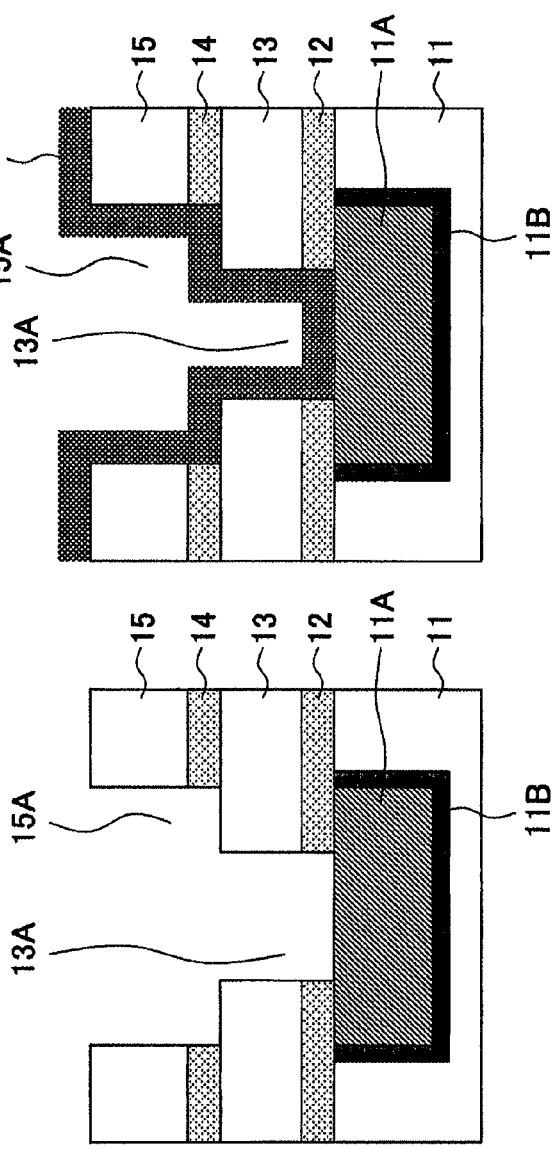

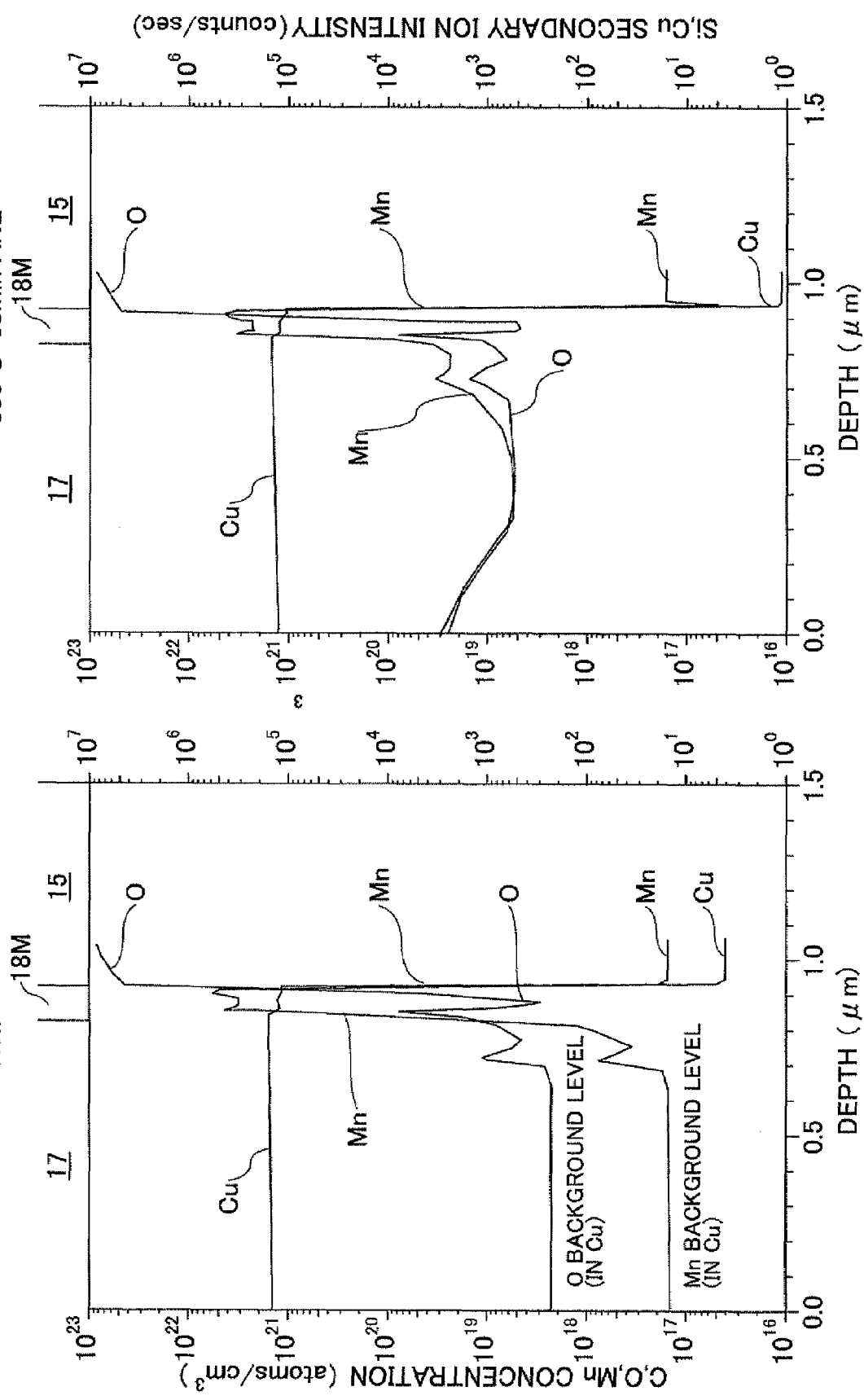

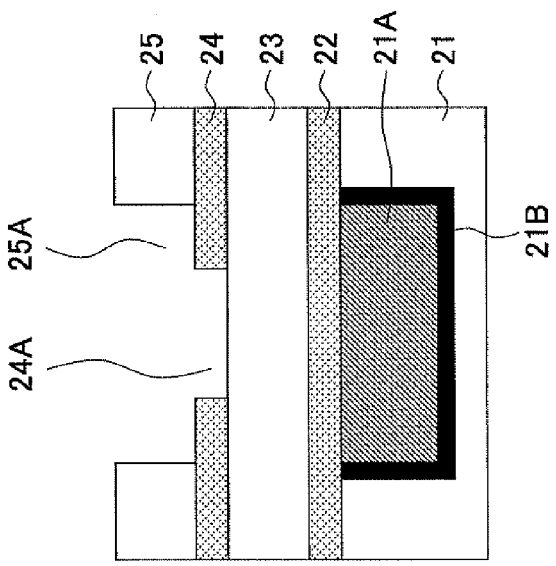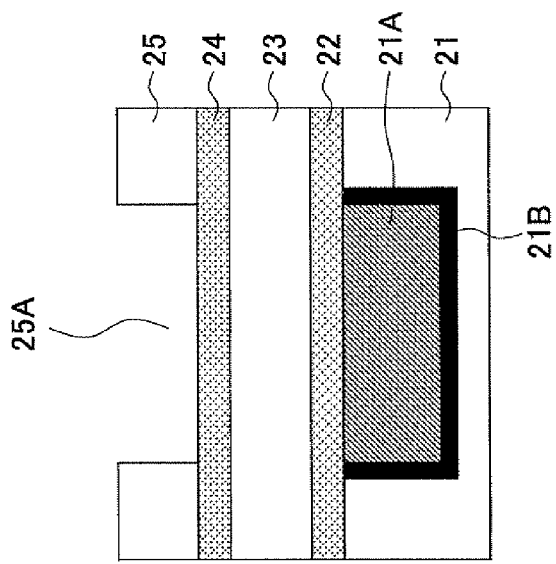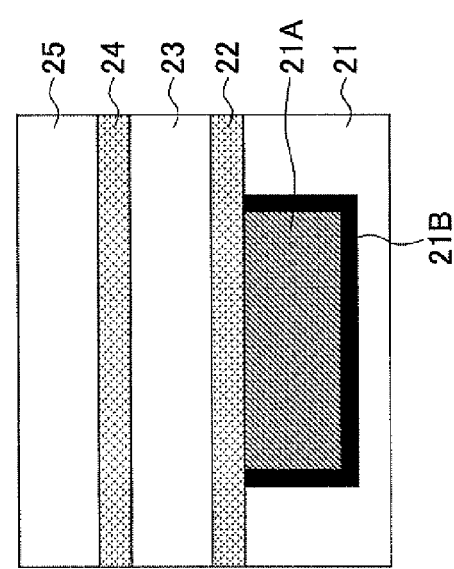

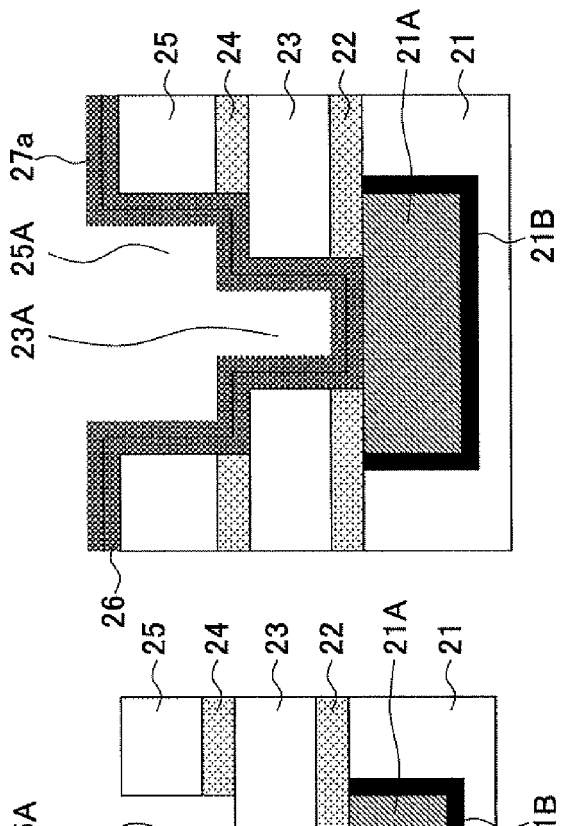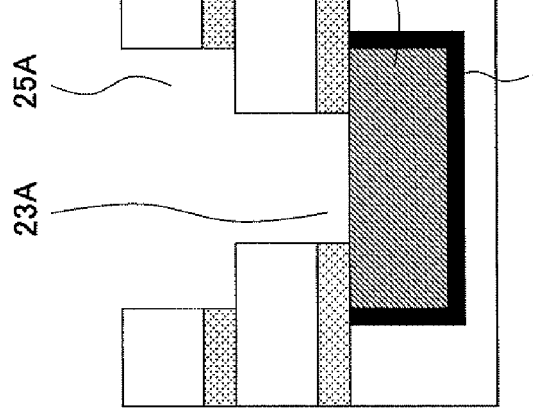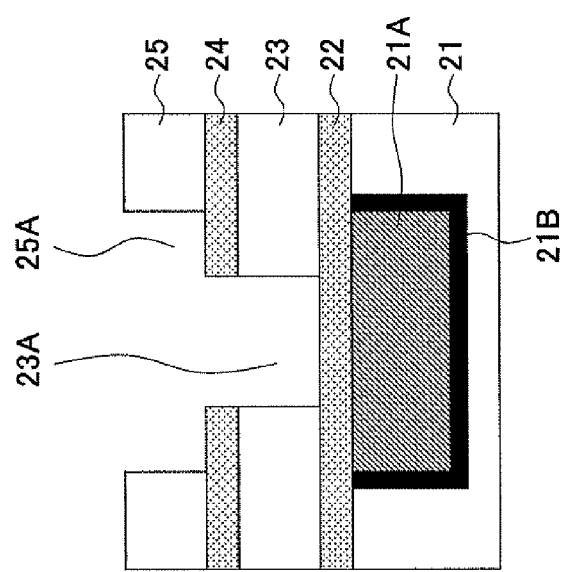

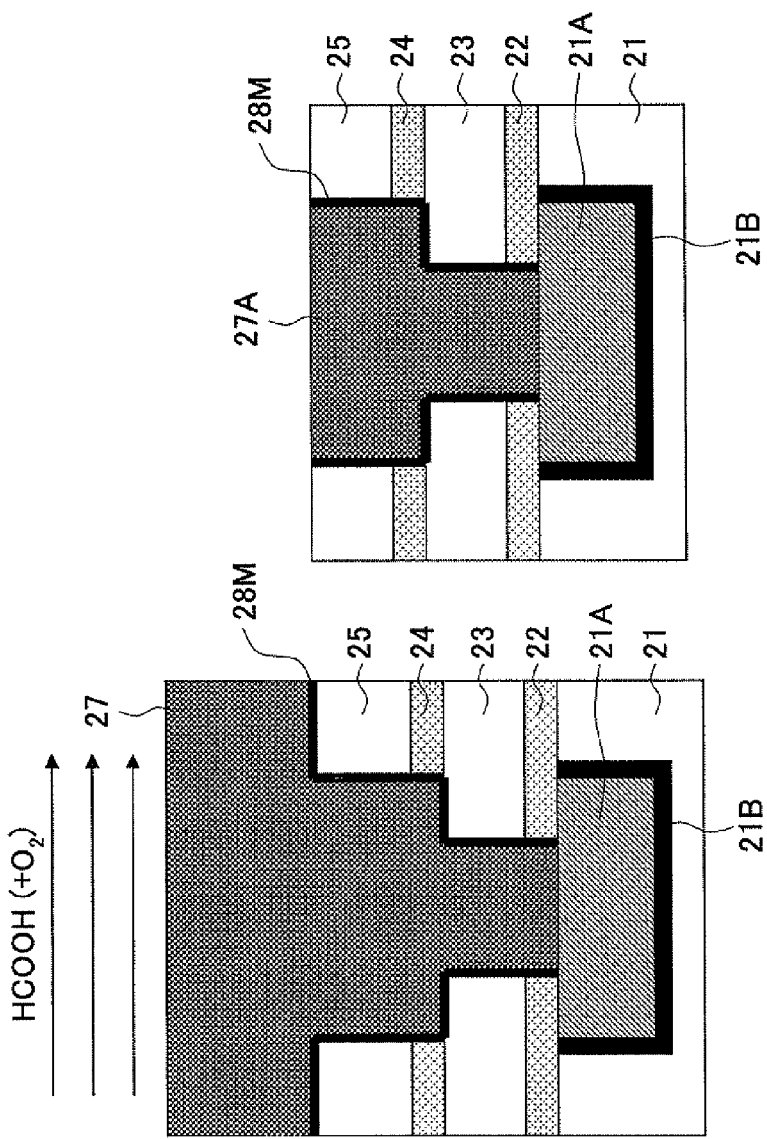

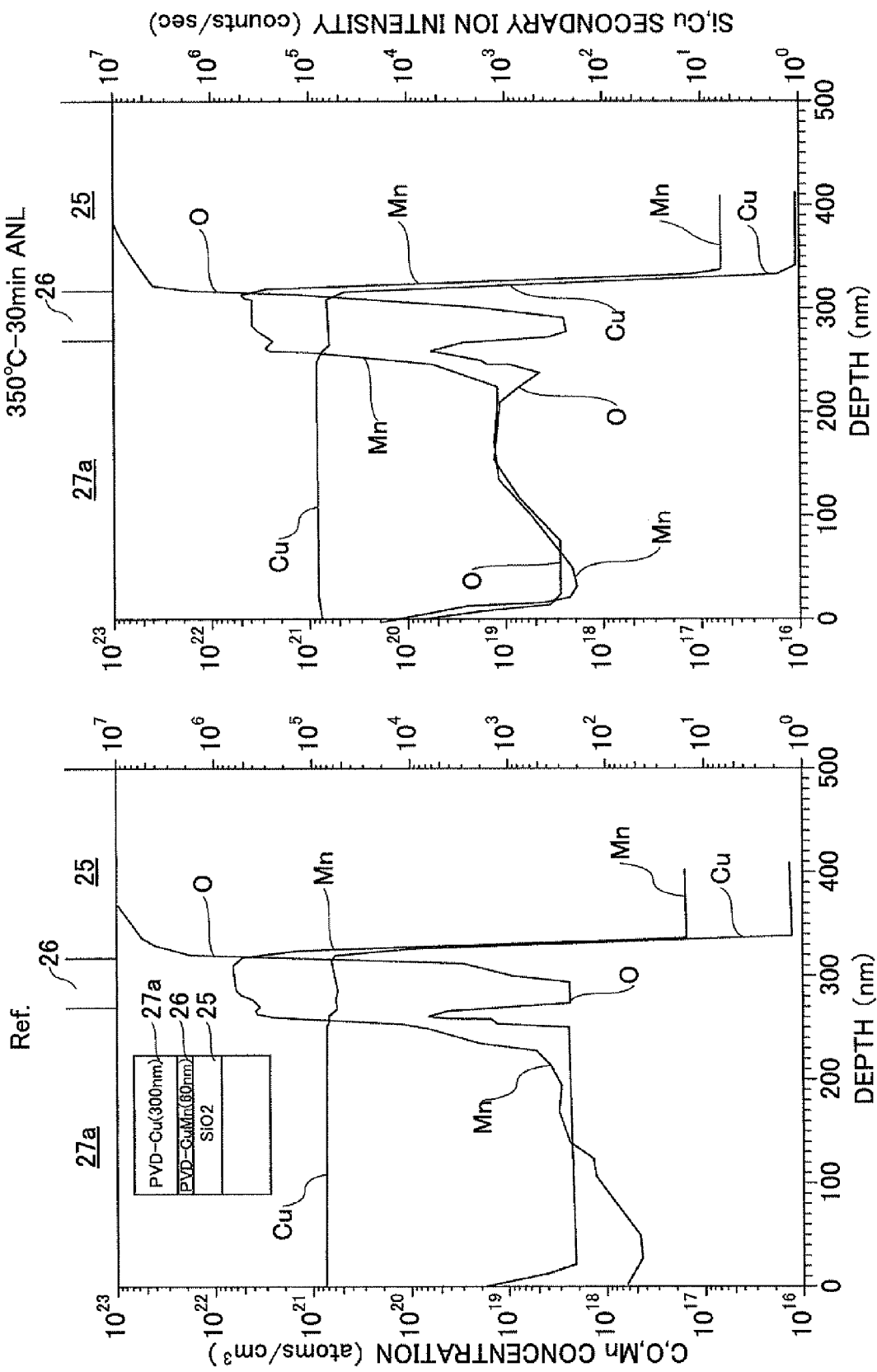

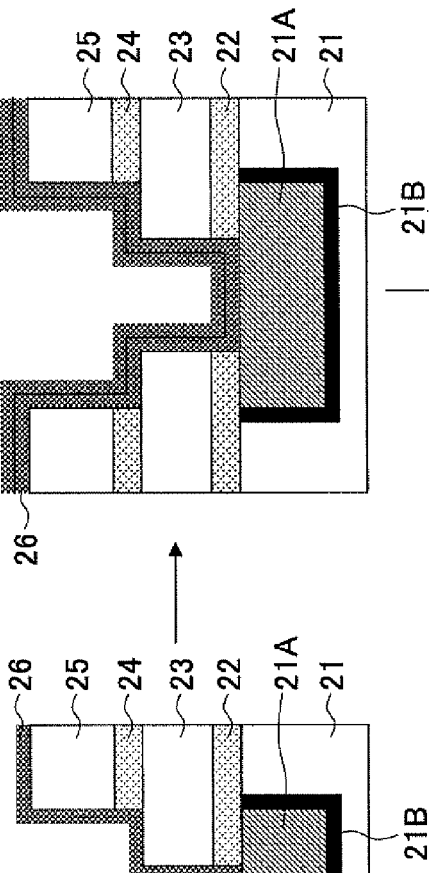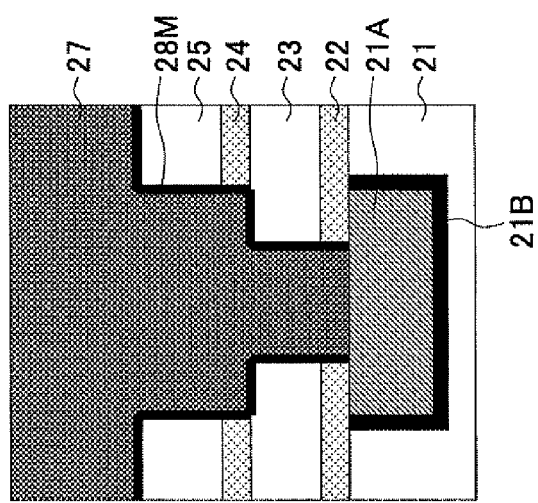

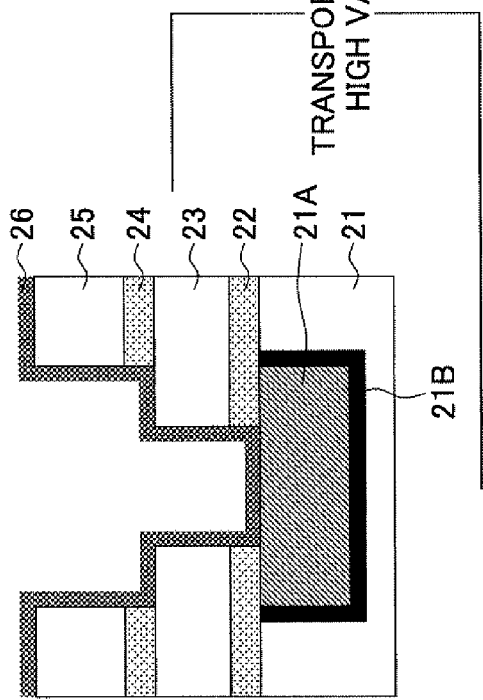
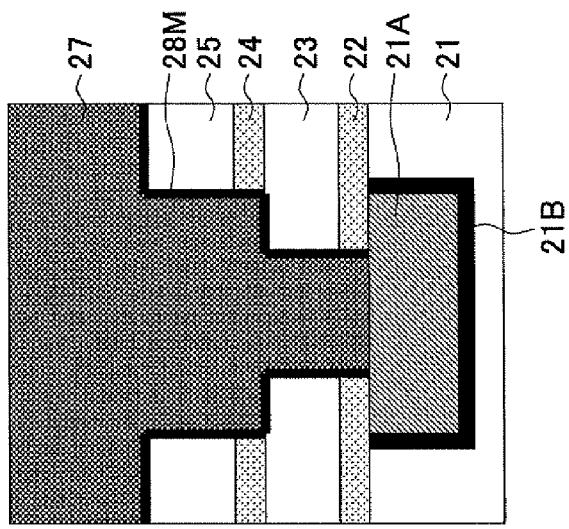
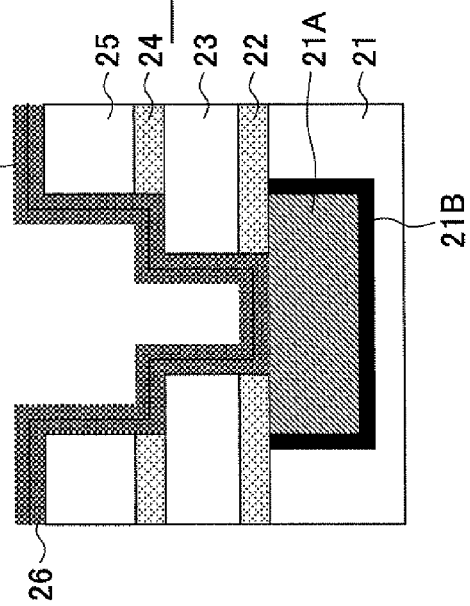

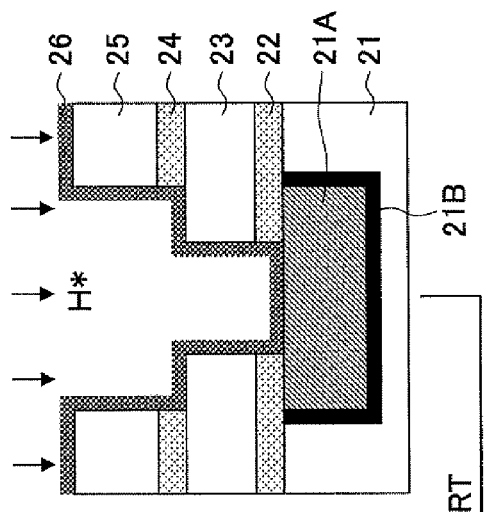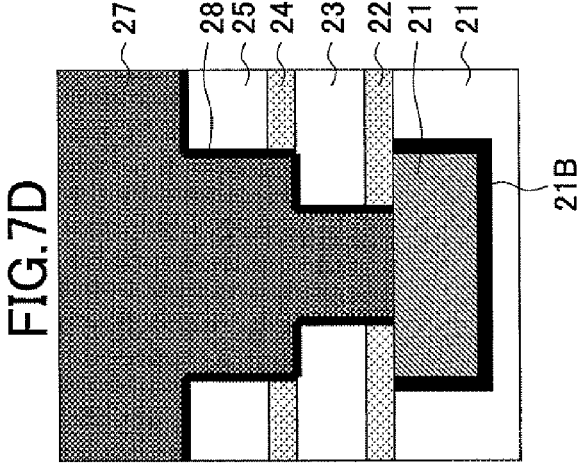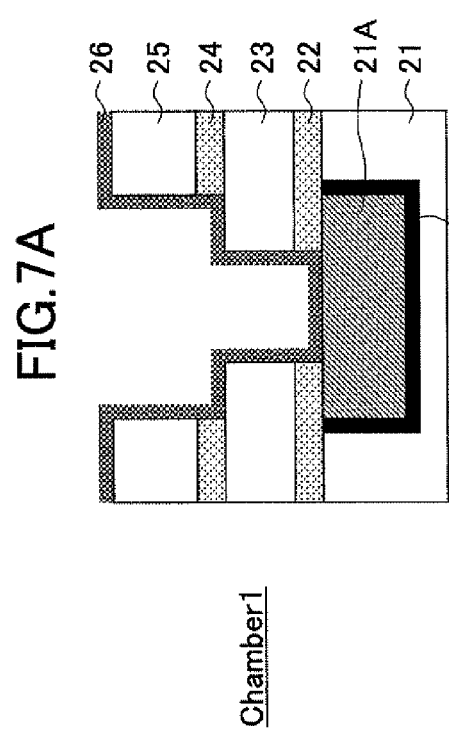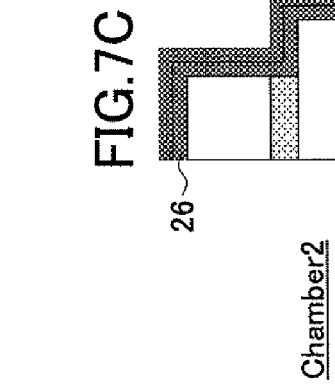

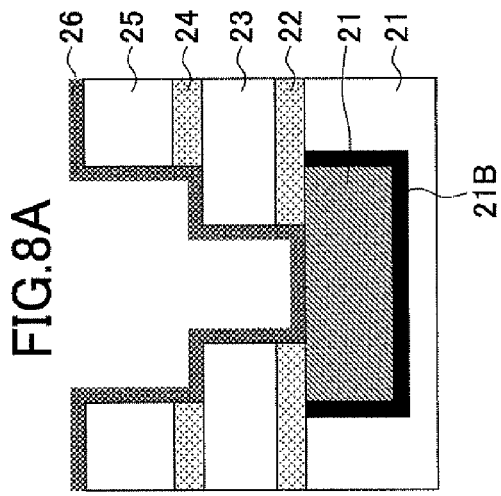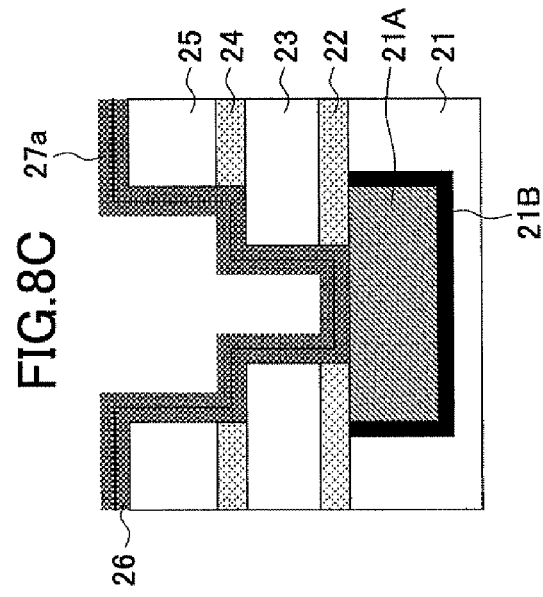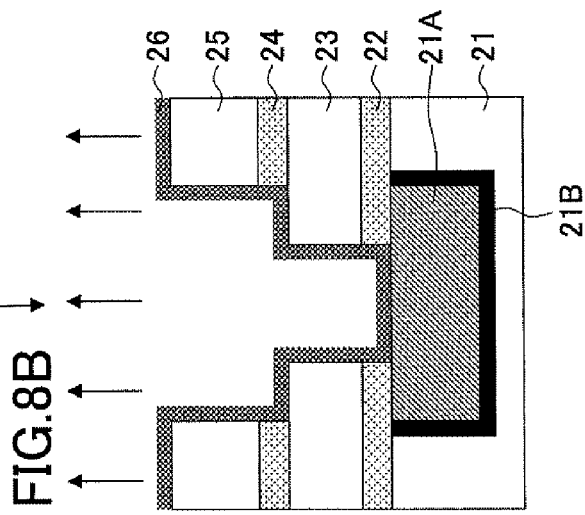

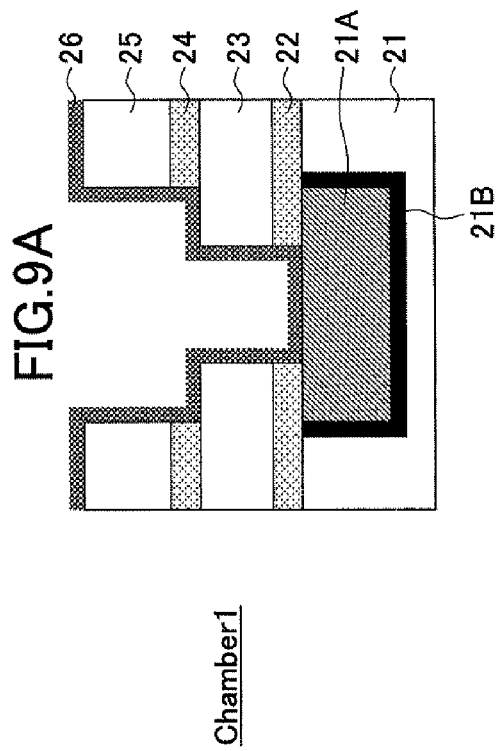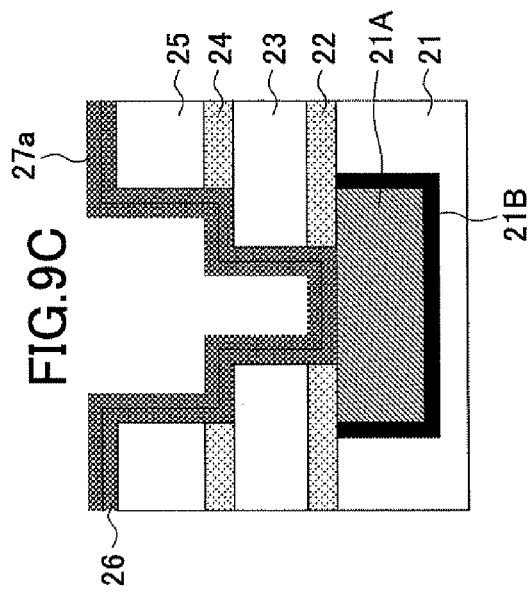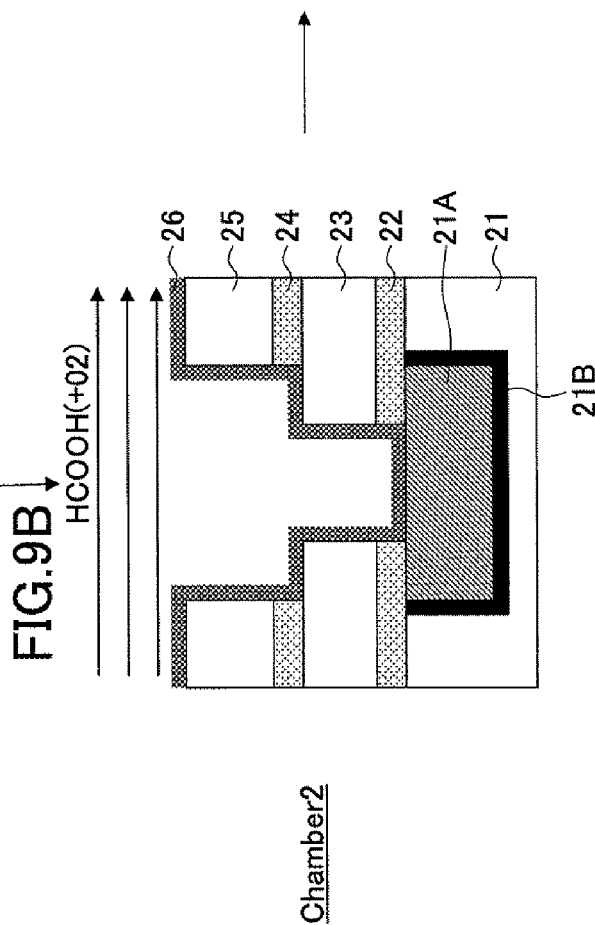

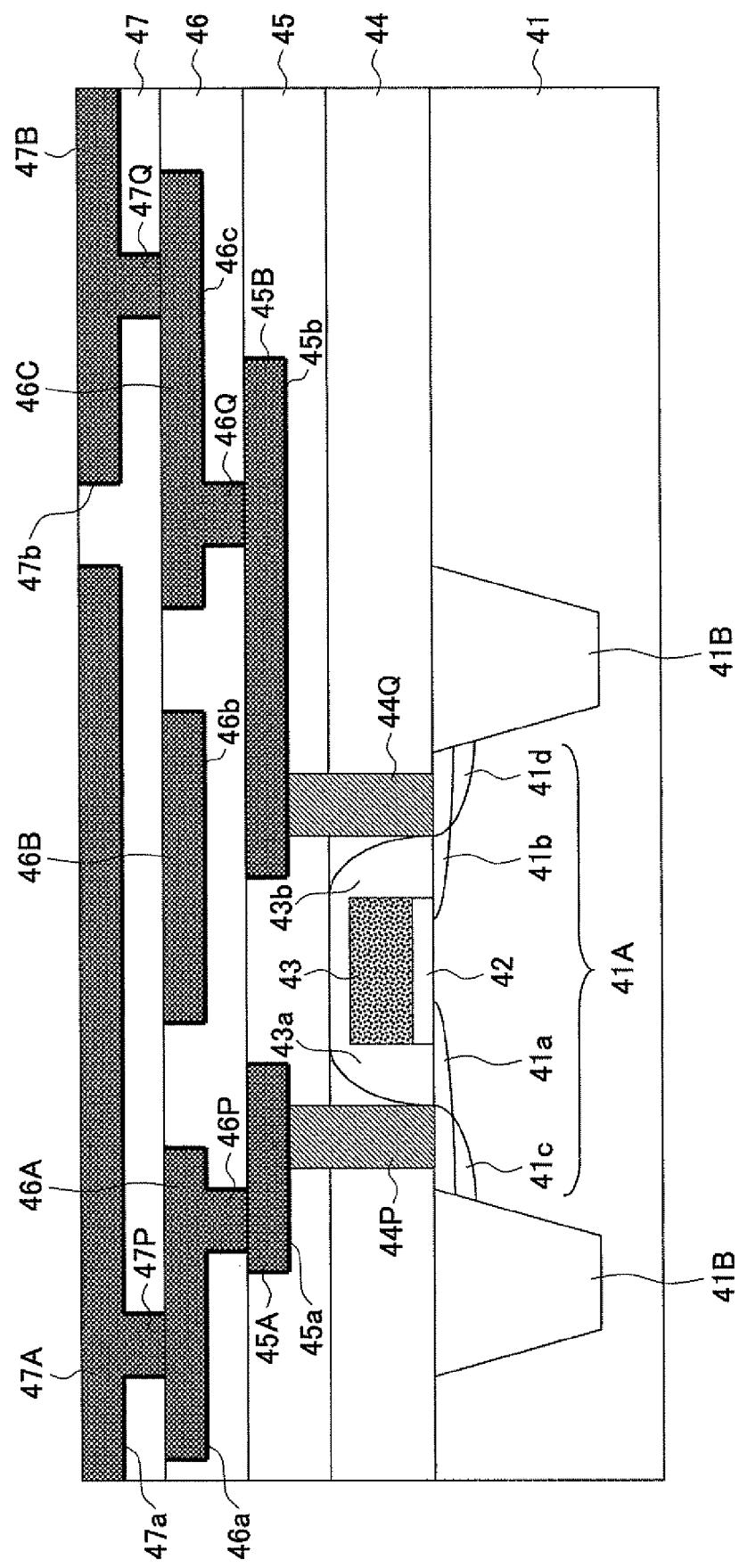

FABRICATION PROCESS OF A SEMICONDUCTOR DEVICE

CROSS-REFERENCE TO RELATED APPLICATION

The present application is based on Japanese priority application No. 2006-307050 filed on Nov. 13, 2006, the entire contents of which are hereby incorporated by reference.

BACKGROUND OF THE INVENTION

The present invention generally relates to semiconductor devices and more particularly to a semiconductor device having a multilayer interconnection structure and fabrication process thereof.

In recent semiconductor integrated circuit devices, a vast number of semiconductor elements are formed on a common substrate, and a multilayer connection structure is used for interconnecting these semiconductor elements.

In multilayer interconnection structure, interlayer insulation films embedded with interconnection patterns constituting an interconnection layer are laminated, and a lower interconnection layer is connected to an upper interconnection layer by way of a via-contact formed in the interlayer insulation film.

In the ultrafine and ultra fast-speed semiconductor devices of these days, a low-dielectric film (so-called low-K film) is used for the interlayer insulation film together with low-resistance Cu pattern used for the interconnection pattern, for reducing the problem of signal delay caused in the multilayer interconnection structure.

In such multilayer interconnection structure in which a Cu interconnection pattern is embedded in a low-K interlayer insulation film, a so-called damascene process or dual damascene process is used in view of the difficulty of patterning a Cu layer by way of dry etching process. In damascene process or dual damascene process, interconnection trenches or via-holes are formed in the interlayer insulation film in advance, and a Cu layer is formed so as to fill the interconnection trenches or via-holes thus formed. Further, excessive Cu layer on the interlayer insulation film is removed by a chemical mechanical polishing (CMP) process.

Thereby, in order to avoid the problem of short circuit or the like, caused when the Cu interconnection pattern has made a direct contact with the interlayer insulation film by the Cu atoms invading into the interlayer insulation film by diffusion, it is practiced in the art to cover the sidewall surfaces and bottom surface of the interconnection trenches or via-holes, on which the Cu interconnection patterns are to be formed, by a conductive diffusion barrier, or so-called barrier metal film, of a refractory metal such as Ta or W or conductive nitride of such a refractory metal element, and to deposit the Cu layer on such a barrier metal film.

On the other hand, with recent ultrafine and ultra fast-speed semiconductor devices of the generation of 45 nm node or later, significant demagnification is in progress with regard to the size of the interconnection trenches and via-holes formed in the interlayer insulation film in correspondence to device miniaturization, and thus, there is a need of decreasing the film thickness of the barrier films formed on such a minute interconnection trenches or via-holes when to maintain the desired decrease of interconnection resistance while using such a conventional barrier metal films, which has a large specific resistance. On the other hand, there is a need that the barrier metal film covers the sidewall surfaces and the bottom surface of the interconnection trenches or via-holes continuously.

Conventionally, use of MOCVD (metal organic CVD) process or ALD (atomic layer deposition) process has been studied as the technology capable of forming extremely thin barrier metal films continuously on such highly miniaturized interconnection trenches or via-holes.

However, such MOCVD process or ALD process generally uses metal organic vapor source, and because of this, the barrier metal film of refractory metal or refractory metal nitride formed with such a process suffers from the problem of poor film quality, in spite of its capability of forming a thin and uniform film. For example, there arises a serious problem of adhesion between the barrier metal film and the interlayer insulation film particularly when a low-dielectric interlayer insulation film of low density, such as inorganic low-K film of SiOCH film or SiC film or organic insulation film, is used.

Meanwhile, US20050218519A describes the technology of covering the interconnection trenches or via-holes in the interlayer insulation film directly with a Cu—Mn alloy layer and forming a manganese silicon oxide layer of the composition of $MnSi_xO_y$ as a diffusion barrier film at the interface between the Cu—Mn alloy layer and the interlayer insulation film with the thickness of 2-3 nm, by inducing a self-forming reaction between Mn in the Cu—Mn alloy layer and Si and oxygen in the interlayer insulation film.

FIGS. 1A-1D show the method of forming a Cu interconnection structure according to US20050218519A.

Referring to FIG. 1A, there is embedded a Cu interconnection pattern 11A in an interlayer insulation film 11 via an ordinary barrier metal film 11B of Ta, TaN, or the like, wherein there are formed interlayer insulation films 13 and 15 over the interlayer insulation film 11 via an etching stopper film 12 of SiC or SiN such that an etching stopper film 14 of SiC or SiN is interposed between the interlayer insulation films 13 and 15. Further, in the state of FIG. 1A, there is formed an interconnection trench 15A in the interlayer insulation film 15 so as to expose the interlayer insulation film 13 at the bottom part thereof, and a via hole 13A is formed in the interlayer insulation film 13 so as to expose the Cu interconnection pattern 11A.

Next, in the step of FIG. 1B, a Cu—Mn alloy layer 16 is formed on the structure of FIG. 1A so as to cover the sidewall surfaces and bottom surface of the interconnection trench 15A and the sidewall surface and the bottom surface of the via hole 13A continuously and directly, wherein the Cu—Mn alloy layer 16 is formed with a thickness of several nanometers by an evaporation deposition process of sputtering process. Further, electroplating process is conducted in the step of FIG. 1C while using the Cu—Mn alloy layer as a seed layer, and as a result, a Cu layer 17 is formed on the interlayer insulation film 15 so as to film the interconnection trench 15A and the via-hole 13A.

Further, in the step of FIG. 1D, the structure of FIG. 1C is annealed in an oxygen gas ambient at the temperature of 400° C., for example. With this, the Mn atoms in the Cu—Mn layer 16 are caused to react with the Si atoms and the oxygen atoms of the interlayer insulation films 13 and 15 exposed at the sidewall surfaces and bottom surfaces of the interconnection trench 15A and the via-hole 13A, and as a result, there is formed a diffusion barrier film 18M of the composition of $MnSi_xO_y$ at the surface of the interconnection trench 15A and the via-hole 13A.

It should be noted that the reaction of FIG. 2D forming the $MnSi_xO_y$ diffusion barrier film 18M is a self-forming reaction or self-organizing reaction characterized by self-limiting phenomenon, and the growth of the MnSixOy layer stops spontaneously, although it depends upon the nature of the underlying film, when the thickness thereof has reached 2-3 nm. Thus, according to such a process, it becomes possible to form an extremely thin diffusion barrier film with extremely uniform film thickness and with reliability.

It should be noted that the etching stopper film 14 is formed of SiC or SiN, while an SiC film or SiN film also contains a small amount of oxygen, and formation of the extremely thin MnSixOy diffusion barrier film 18M takes place also on the exposed surface of the etching stopper film similarly. On the other hand, the Cu interconnection pattern 11A is subjected to a process of removal of native oxide film prior to the step of FIG. 1B by a reverse sputtering process, or the like, and is thus free from oxygen. Thus, there occurs no formation of the diffusion barrier film 18M at the interface between the Cu interconnection pattern 11A and the Cu layer 17. Thus, a direct and good contact is attained between the Cu interconnection pattern 11A and the Cu layer 17.

In the thermal annealing process of FIG. 1D, the Mn atoms contained in the Cu—Mn alloy layer 16 but not contributing to the formation of the MnSixOy layer cause diffusion into the Cu layer 17 and form a Mn oxide layer 18 having a composition represented as MnxOy by causing reaction with oxygen in the ambient when reached the surface of the Cu layer 17. This is because that Mn has a larger ionization tendency over Cu. Thus, in the step of FIG. 1D, not only the barrier metal film 18M is formed, but there also occurs precipitation of Mn atoms in the Cu layer 17 on the surface of the Cu layer 17 in the form of the Mn oxide layer 18, and as a result, there is caused decrease of Mn concentration in the Cu layer 17, leading to reducing of specific resistance of the Cu layer 17.

Further, in the step of FIG. 1E, the excessive Cu layer 17 on the interlayer insulation film 15 is removed together with the foregoing Mn oxide layer 18 by a CMP process, and with this, a Cu pattern 18 filling the via-hole 13A and the interconnection trench 15A is formed together with the uniform MnSixOy diffusion barrier film 18M of the thickness of 2-3 nm.

Meanwhile, the inventor of the present invention has noted, in the investigation constituting the foundation of the present invention, about the possibility that there may be formed stable Mn oxide film on the surface of the Cu—Mn alloy layer 16 in the initial phase of thermal annealing process at the time of transition from the step of FIG. 1C to the thermal annealing process of FIG. 1D and that the transition to the structure of FIG. 1D may be hampered as a result of formation of such a stable Mn oxide film.

FIGS. 2A and 2B are SIMS profile diagrams showing the distribution of Cu, Mn and O atoms in the interlayer insulation film 15, the Cu—Mn alloy layer 18M and the Cu layer 17 along the cross-section A-A' in the state of FIG. 1D. It should be noted that the SIMS profile of FIGS. 2A and 2B was discovered for the first time by the inventor of the present invention in the investigation that constitutes the foundation of the present invention, wherein FIG. 2A shows the state before annealing while FIG. 2B shows the state after annealing at 350° C. for 30 minutes.

Referring to FIGS. 2A and 2B, it can be seen that there appears a spike of Mn and oxygen at the interface between the Cu—Mn alloy layer 18M and the interlayer insulation film 15 in correspondence to the expected thin MnSiOx layer or MnxOy layer, while there is also observed a spike of Mn and oxygen at the surface of the Cu—Mn alloy layer 18, and hence at the interface to the Cu layer 17, indicating formation of a Mn oxide layer also in this part.

Such a Mn oxide layer functions to block the excessive Mn atoms in the Cu—Mn alloy layer 18M from causing diffusion to the surface of the Cu layer 17, and thus, it becomes difficult to decrease the specific resistance in the Cu pattern 17A of FIG. 1E when there occurs formation of such an Mn oxide layer.

SUMMARY OF THE INVENTION

A method for fabricating a semiconductor device has forming an opening defined by an inner wall surface in an insulation film, covering said inner wall surface with a Cu—Mn alloy layer, depositing a first Cu layer over said Cu—Mn alloy layer without exposing said Cu—Mn alloy layer to the air, depositing a second Cu layer over said first Cu layer and filling said opening with said second Cu layer, and forming a barrier layer over said inner wall surface as a result of a reaction between Mn in said Cu—Mn alloy layer and said insulation film.

BRIEF DESCRIPTION OF THE DRAWINGS

FIGS. 1A-1E are diagrams showing the process of forming a Cu interconnection structure according to a related art of the present invention;

FIGS. 2A and 2B are diagrams explaining the problems in the related art of the present invention;

FIGS. 3A-3I are diagrams showing the process of fabricating a semiconductor device according to a first embodiment of the present invention;

FIGS. 4A and 4B are diagrams explaining the effect of the present invention;

FIGS. 5A-5C are different diagrams showing the process of fabricating a semiconductor device according to the first embodiment of the present invention;

FIGS. 6A-6C are diagrams showing the process of fabricating a semiconductor device according to a second embodiment of the present invention;

FIGS. 7A-7D are diagrams showing the process of fabricating a semiconductor device according to a third embodiment of the present invention;

FIGS. 8A-8C are diagrams showing the process of fabricating a semiconductor device according to a fourth embodiment of the present invention;

FIGS. 9A-9C are diagrams showing the process of fabricating a semiconductor device according to a fifth embodiment of the present invention; and FIG. 10 is a diagram showing the construction of a semiconductor device according to a sixth embodiment of the present invention.

DETAILED DESCRIPTION OF THE PREFERRED EMBODIMENTS

First Embodiment

Figure 1D:
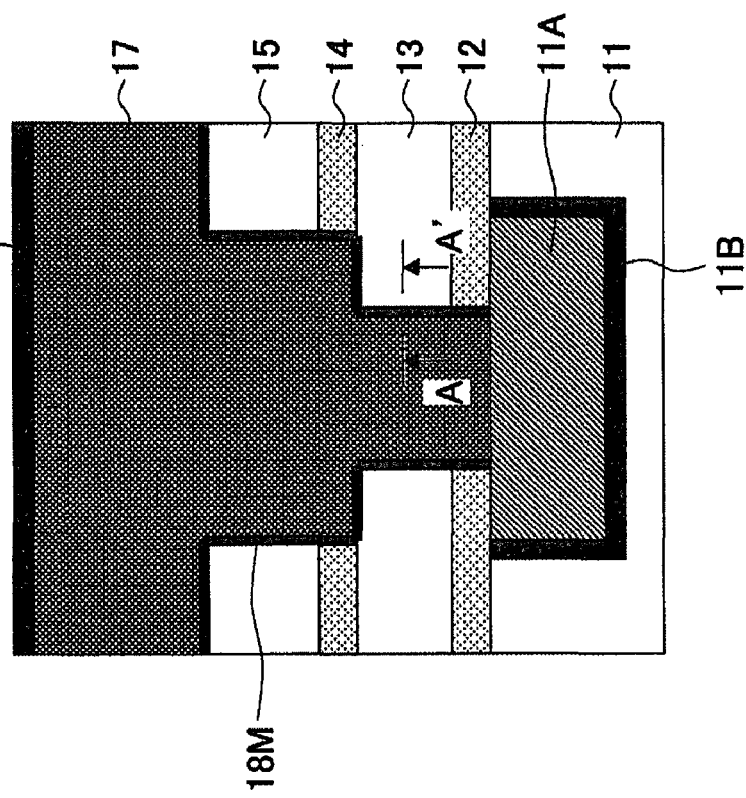
Figure 1E:
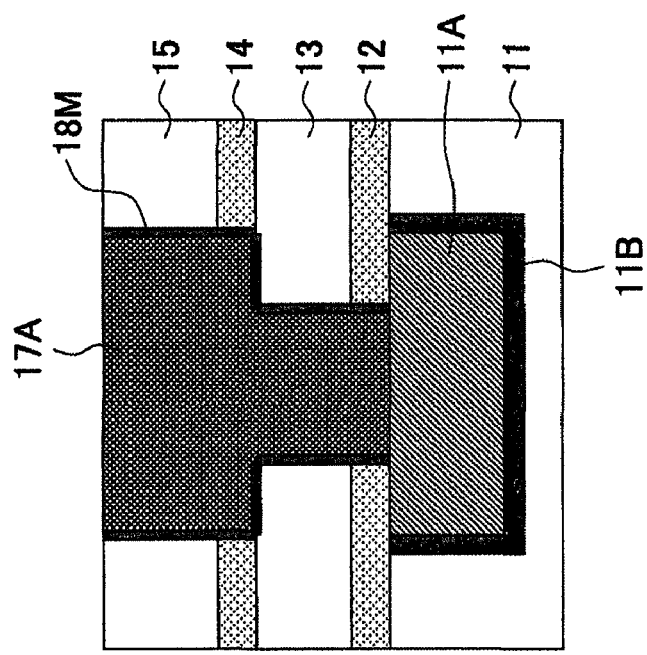

FIGS. 3A-3I show the fabrication process of a semiconductor device having a Cu interconnection structure according to a first embodiment of the present invention.

Referring to FIG. 3A, the semiconductor device of the present invention is a semiconductor device of the 45 nm node and includes an interlayer insulation film 21 formed on a substrate not illustrated, wherein a Cu interconnection pattern 21A of a width of 65 nm, for example, is embedded in the interlayer insulation film 21 via an ordinary barrier metal film 21B of Ta, TaN, or the like.

Further, on the interlayer insulation film 21, there are provided interlayer insulation films 23 and 25 each having a film thickness of 100-300 nm and formed by a plasma CVD process that uses TEOS for the source, via an etching stopper film 22 of SiC or SiN formed by a plasma CVD process with a film thickness of 10-50 nm, with an intervening etching stopper film 24 of SiC or SiN formed by a plasma CVD process with a thickness of 10-100 nm.

Next, in the step of FIG. 3B, there is formed an interconnection trench 25A having a width of 65 nm, for example in the interlayer insulation film 25 so as to expose the etching stopper film 24, and an opening 24A having a diameter of 65 nm is formed in the step of FIG. 3C in the etching stopper film 24 exposed by the interconnection trench 24 in correspondence to a via-hole to be formed, such that the opening 24A exposes the underlying interlayer insulation film 23.

Further, in the step of FIG. 3D, a via-hole 23A is formed in the interlayer insulation film 23 with the diameter of 65 nm, for example, while using the etching stopper film 24A as a hard mask, such that the etching stopper film 22 is exposed, and in the step of FIG. 3E, the etching stopper film 24 exposed at the bottom of the interconnection trench 25A and the etching stopper film 22 exposed at the bottom of the via-hole 23A are removed simultaneously. With this the interconnection pattern 21A is exposed. In the case a low-K film is used for the interlayer insulation film, it is preferable to conduct a process of removing water adsorbed to the interlayer insulation film as a post processing of the interlayer insulation film, wherein the post processing may be conducted in the form of a UV curing process or in the form of a thermal annealing process conducted at 150-350° C. Further, it is possible to conduct a process of curing etching damages by supplying a silane gas or methane gas.

Further, it is preferable to conduct a reducing processing in the form of hydrogen annealing process as a pre-processing of the process of forming Cu—Mn layer to be explained below.

Next, in the step of FIG. 3F, a Cu—Mn alloy layer 26 containing therein Mn with 0.1-10 atomic %, such as 5 atomic %, is formed on the structure of FIG. 3E by a sputtering process with a thickness of 10-150 nm, such as 50 nm, so as to cover continuously and directly the sidewall surfaces and bottom surface of the interconnection trench 25A and the sidewall surface and bottom surface of the via-hole 23A. Therein, the inner wall surface of the opening including the interconnection trench 25A and the via-hole 23A is covered with the Cu—Mn alloy layer 26 having a thickness of about 5-20 nm. It should be noted that the Cu—Mn alloy layer 26 can be formed also by a CVD process or ALD (atomic layer deposition) process, in addition to the sputtering process.

The Cu—Mn alloy layer 26 thus formed has a shape conformal to the shape of the interconnection trench 25A and the via-hole 23A.

Further, in the step of FIG. 3F, a Cu layer 27a is formed with a thickness of 5-100 nm subsequent to the film formation of the Cu—Mn alloy layer 26 without breaking the vacuum while using the same film forming apparatus. Thus, in the case the Cu—Mn alloy layer 26 is formed by a sputtering process, the Cu layer 27a is formed in the same sputtering apparatus. In the case the Cu—Mn alloy layer 26 is formed by a CVD process, the Cu layer 27a is formed in the same CVD apparatus. Further, in the case the Cu—Mn alloy layer 26 is formed by an ALD process, the Cu layer 27a is formed in the same ALD apparatus. With this, there is formed a Cu layer on the Cu—Mn alloy layer 26 covering the inner wall surface of the opening with a thickness of about 3-10 nm.

The Cu layer 27a thus formed has a shape conformal to the shape of the interconnection trench 25A and the via-hole 23A on the foregoing Cu—Mn alloy layer 26.

Further, in the step of FIG. 3G, an electrolytic plating process is conducted while using the Cu layer 27a as a seed layer, and there is formed a Cu layer 27 so as to fill the interconnection trench 25A and the via-hole 23A. Further, in the step of FIG. 3H, the structure of FIG. 3G is held in an ambient in which a formic acid (HCOOH) is added to the Ar carrier gas supplied with the flow rate of 300 SCCM, wherein the formic acid is added with a proportion of 100 SCCM under the process pressure of 10-1000 Pa, such as 100 Pa, and thermal annealing process is conducted at a temperature of 100° C. or higher but not exceeding 400° C., such as 300° C., over the duration of 10-3600 seconds, such as 360 seconds.

As a result of such a thermal annealing process, Mn in the Cu—Mn layer 26 cause reaction with oxygen in the interlayer insulation films 23 and 25 exposed at the sidewall surfaces and bottom surfaces of the interconnection trench 25A and the via-hoe 23A, and as a result, there is formed a diffusion barrier film 28M of the composition of $MnSi_xO_y$ on the surfaces of the interconnection trench 25A and the via-hole 23A.

In the step of FIG. 3H, the Mn atoms released from the Cu—Mn alloy layer 26 also cause diffusion into the Cu layer 27 during such a thermal annealing process, and as a result, the distinction between the Cu—Mn alloy layer 26 and the Cu layer 27 disappears. The Mn atoms thus caused diffusion into the Cu layer 27 form a gaseous reaction product $Mn(HCOO)_2$ and $H_2$ by causing a reaction:

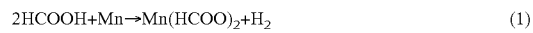

$$2HCOOH + Mn \rightarrow Mn(HCOO)_2 + H_2 \qquad (1)$$

when reacted with the formic acid (HCOOH) of the ambient, and as a result, Mn is removed continuously from the Cu layer 27 to the outside of the system. In the foregoing removal process, it is also possible to use carboxylic acid, hexafluoroacethylacetonate, $H_2O$, $CO_2$, or the like, in addition to the formic acid.

Thereby, it should be noted that the present embodiment covers the Cu—Mn alloy layer 26, after the formation thereof, by the Cu layer 27a in the same film forming apparatus, without exposing the Cu—Mn alloy layer 26 to the air. Thus, formation of Mn oxide layer on the surface of the Cu—Mn alloy layer 26 is suppressed and there occurs extensive diffusion of excessive Mn atoms in the Cu—Mn alloy layer 26 and not contributing to the reaction (1) to the surface of the Cu layer 27 without being hampered by the Mn oxide layer.

FIGS. 4A and 4B show the SIMS profile of the Cu atoms, Mn atoms and oxygen atoms in the structure of FIG. 3G taken along the cross-section B-B'. It should be noted that the SIMS profile was obtained for the specimen shown in FIG. 4A in which a silicon oxide film is formed on a silicon substrate in correspondence to the interlayer insulation film 25, a Cu—Mn alloy layer is formed thereon in correspondence to the Cu—Mn alloy layer 26 with a thickness of 60 nm, and a Cu layer 27a is formed further thereon by a sputtering process with the thickness of 300 nm. FIG. 4A shows the state before the thermal annealing process, while FIG. 4B shows the state after conducting the thermal annealing process at 350° C. for 30 minutes.

Referring to FIGS. 4A and 4B, it can be seen that the remarkable spikes of Mn and oxygen observed at the interface between the Cu—Mn alloy layer and the Cu layer in the previous SIMS profiles of FIGS. 2A and 2B are lowered, while this indicates that formation of Mn oxide is suppressed effectively in this part as a result of deposition of the Cu layer 27a conducted immediately after formation of the Cu—Mn alloy layer 26.

In the step of FIG. 3H, it is also possible to add an oxygen gas to the formic acid ambient. In this case, there is formed a manganese oxide ($MnO_2$) at the surface of the Cu film as a result of reaction between the Mn atoms and oxygen, while this manganese oxide forms the gaseous reaction products $Mn(HCOO)_2$, $H_2O$ and $O_2$ as a result of the reaction with the formic acid as:

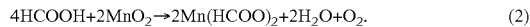

$$4HCOOH+2MnO_2 \rightarrow 2Mn(HCOO)_2+2H_2O+O_2. \quad (2)$$

Again, Mn is removed continuously from the Cu layer 27 to outside of the system.

FIGS. 5A-5C summarize the process of the present invention from a different viewpoint. In the drawings, those parts explained before are designated by the same reference numerals and the description thereof will be omitted.

Referring to FIG. 5A, the Cu—Mn alloy layer 26 is formed in the first film forming apparatus (Chamber 1) in the first step of FIG. 3F, and the Cu layer 27a is formed immediately on the Cu—Mn alloy layer 26 in the step of FIG. 5B corresponding to the second step of FIG. 3F, without breaking vacuum.

Further, the structure of FIG. 5B in which the Cu—Mn alloy layer 26 is thus covered with the Cu layer 27a is transported to a plating processing apparatus through the air, and the Cu layer 17 is formed in the step of FIG. 5C. Because the surface of the Cu—Mn alloy layer 26 is covered with the Cu layer 27a in this case, formation of the Mn oxide film on this surface is suppressed effectively as explained before, and it becomes possible to decrease the resistance of the Cu layer 27 effectively by applying the thermal annealing process of FIG. 3H to the structure of FIG. 5C thus obtained.

In the step of FIG. 3H, it is also possible to use the ambient containing carboxylic acid such as acetic acid ($CH_3COOH$), hexafluoroacetylacetonate, or the like, in addition to the formic acid. Further it is possible to use the ambient of $H_2O$ or $CO_2$ in addition to the ambient of carboxylic acid.

Finally, in the step of FIG. 3I, the excessive Cu layer 27 on the interlayer insulation film 25 is removed by a chemical mechanical polishing process until the interlayer insulation film 25 is removed, and with this, an interconnection structure in which a Cu interconnection pattern 27A is embedded in the interconnection trench 25A is obtained.

For the Cu interconnection pattern 27A thus obtained, a specific resistance of 1.9 μΩcm was observed in the measurement conducted to a test piece. It should be noted that this value of specific resistance is about one-half of the specific resistance value observed in the experiment of FIG. 2.

In the present embodiment, it should be noted that the interlayer insulation films 23 and 25 are not limited to the CVD-TEOS ($SiO_2$) film, but other low-K films, such as inorganic SOD (spin-on-dielectric) film, organic SOG (spin-on-glass) film, CVD (chemical vapor deposition) films of SiC, SiOCH, SiOF, and the like, or porous films thereof, may also be used. It should be noted that the technology of the diffusion barrier film of the present invention is applicable also to low-K organic insulation films such as aromatic polyether film free from oxygen in the nominal composition thereof, as long as the film contains a small, but sufficient amount of oxygen for the self-formation process of the extremely thin Mn oxide film noted before. In the case the interlayer insulation film does not contain Si, the diffusion barrier film 18M takes the composition of $Mn_xO_y$.

In the present embodiment, it is possible to repeat the process of FIG. 3H a plural times. By repeatedly exposing the Cu layer to the ambient that form a gaseous reaction product when reacted with Mn oxide, it becomes possible to reduce the concentration of Mn in the Cu layer 27.

Second Embodiment

Next, the process of forming a Cu interconnection structure according to a second embodiment of the present invention will be described with reference to FIGS. 6A-6C. In the drawings, those parts explained before are designated by the same reference numerals and the description thereof will be omitted.

In the present embodiment, the Cu—Mn alloy layer 26 is formed in the first film forming apparatus (chamber 1) in the step of FIG. 6A corresponding to the first step of FIG. 3F, and the structure of FIG. 6A is transported to a second film forming apparatus (chamber 2) in the step of FIG. 6B through a high-vacuum environment of the pressure of $1 \times 10^{-7}$ Pa or less together with the substrate (not shown) carrying the structure of FIG. 6A thereon while using a single-wafer processing apparatus equipped with a vacuum transportation chamber. There, the second step of the process of FIG. 3F is carried out. As a result, the Cu film 27a is formed on the Cu—Mn alloy layer 26.

Further, the structure of FIG. 6B is transported to a plating processing apparatus through the air, and the Cu layer 17 is formed in the step of FIG. 6C.

In the present embodiment, the structure of FIG. 6A is transported under the high-vacuum environment, and thus, formation of Mn oxide film is suppressed at the surface of the Cu—Mn alloy layer 26. Thus, by applying the thermal annealing process of FIG. 3H to the structure of FIG. 6C, it becomes possible to reduce the electric resistance of the Cu layer 27 effectively.

After the step of FIG. 6C, the same process to the process of FIGS. 3H and 3I is carried out. The description thereof will therefore be omitted.

Third Embodiment

Next, the process of forming a Cu interconnection structure according to a third embodiment of the present invention will be described with reference to FIGS. 7A-7D. In the drawings, those parts explained before are designated by the same reference numerals and the description thereof will be omitted.

With the present embodiment, the Cu—Mn alloy layer 26 is formed in the step of FIG. 7A corresponding to the first step of FIG. 3F in the first film forming apparatus (chamber 1) and the surface of the Cu—Mn alloy layer 26 thus formed is exposed to the hydrogen radicals in the step of FIG. 7B in the same first film forming apparatus. With this, the surface of the Cu—Mn alloy layer 26 is terminated with hydrogen. The hydrogen radicals may be generated by forming hydrogen plasma. This hydrogen plasma processing may be conducted under the temperature of 100-150° C.

Meanwhile, there is a case that the low-K film constituting the interlayer insulation film is damaged as a result of such a hydrogen plasma processing. In such a case, there may be conducted an additional damage curing process in the form of a thermal annealing process conducted at the temperature of 150-350° C. or by supplying a silane gas or methane gas.

Further, the structure of FIG. 7B is transported in the step of FIG. 7C from the first processing apparatus to the second processing apparatus (chamber 2) together with the substrate (not shown) through a vacuum environment while using a single-wafer processing apparatus equipped with a vacuum transportation chamber, and the second step of FIG. 3F is conducted in the second processing apparatus. As a result, the Cu film 27a is formed on the Cu—Mn alloy layer 26.

Further, the structure of FIG. 7C is transported to a plating processing apparatus through the air, and the Cu layer 17 is formed in the step of FIG. 7D.

Further, the electrical resistance of the Cu layer 27 is decreased by applying the thermal annealing process of FIG. 3H to the structure of FIG. 7D.

After the step of FIG. 7D, the same process to the process of FIGS. 3H and 3I is carried out. The description thereof will therefore be omitted.

With the present embodiment, surface activity of the Cu—Mn alloy layer 26 is lowered by conducting the process of FIG. 7B, and thus, formation of the Mn oxide film layer at the surface of the Cu—Mn alloy layer 26 is effectively suppressed even when a vacuum transportation chamber of ordinary degree of vacuum is used for transporting the substrate from the film forming apparatus 1 to the film forming apparatus 2. Depending on the situation, it is also possible to transport the substrate from the film forming apparatus 1 to the film forming apparatus 2 through the air.

Further, it is also possible to carry out the step of FIG. 7C in the same film forming apparatus used in the step of FIGS. 7A and 7B. In this case, formation of the Mn oxide layer can be suppressed further.

Further, depending on the situation, it is also possible to omit the step of FIG. 7C by conducting the step of FIG. 7B and transport the substrate to be processed to the plating processing apparatus in the state of hydrogen termination. There, the Cu layer 17 is formed in the step of FIG. 7D.

Fourth Embodiment

Next, the process of forming a Cu interconnection structure according to a fourth embodiment of the present invention will be described with reference to FIGS. 5A-8C. In the drawings, those parts explained before are designated by the same reference numerals and the description thereof will be omitted.

In the present embodiment, the Cu—Mn alloy layer 26 is formed in the first film forming apparatus (chamber 1) in the step of FIG. 8A corresponding to the first step of FIG. 3F, and the structure of FIG. 8A is transported to a second film forming apparatus (chamber 2) in the step of FIG. 8B through a vacuum environment together with the substrate (not shown) carrying the structure of FIG. 8A thereon while using a single-wafer processing apparatus equipped with a vacuum transportation chamber.

In the present embodiment, a re-sputtering process is conducted in the step of FIG. 5B in the second processing apparatus, and the oxide film formed on the surface of the Cu—Mn alloy layer 26 is physically removed. Next, the step of FIG. 8C is conducted in correspondence to the second step of FIG. 3F, and the Cu layer 27a is formed on the surface of the Cu—Mn alloy layer 26 from which the oxide film is removed. As a result, the Cu film 27a is formed on the Cu—Mn alloy layer 26.

Further, the structure of FIG. 5C is transported to the plating processing apparatus through the air, and the Cu layer 17 is formed by conducting a process (not shown) similar to that of the step of FIG. 5C.

With the present embodiment, the oxide layer formed on the Cu-M alloy layer 16 is removed physically in the step of FIG. 8B, and thus, it is possible to decrease the electric resistance of the Cu layer 27 effectively by conducting the thermal annealing process of FIG. 3H after the plating processing.

After the step of FIG. 8C, the same process to the process of FIGS. 3H and 3I is carried out. The description thereof will therefore be omitted.

It should be noted that, with the present embodiment, the transportation of the substrate from the step of FIG. 8A to the step of FIG. 8B can be conducted also through the air. Further, the process of FIG. 8A and the process of FIG. 8B may be conducted in the same film forming apparatus such as a sputtering apparatus.

Fifth Embodiment

Next, the process of forming a Cu interconnection structure according to a fifth embodiment of the present invention will be described with reference to FIGS. 9A-9C. In the drawings, those parts explained before are designated by the same reference numerals and the description thereof will be omitted.

In the present embodiment, the Cu—Mn alloy layer 26 is formed in the first film forming apparatus (chamber 1) in the step of FIG. 9A corresponding to the first step of FIG. 3F, and the structure of FIG. 9A is transported to a second film forming apparatus (chamber 2) in the step of FIG. 9B through a vacuum environment together with the substrate (not shown) carrying the structure of FIG. 9A thereon while using a single-wafer processing apparatus equipped with a vacuum transportation chamber.

In the present embodiment, the process of exposing the Cu—Mn alloy layer 26 to a reactive gas, such as HCOOH gas, that causes reaction (1) or (2) with Mn oxide, is conducted at first in the step of FIG. 9B while using the second film forming apparatus, and the oxide film formed on the surface of the Cu—Mn alloy layer 26 is removed chemically.

Thereby, it is effective to carry out the processing with the HCOOH gas while heating to a temperature of 100-400° C. Further, it is possible to use other gases such as carboxylic acid, hexafluoroacetylacetonate, $H_2O$, $CO_2$, and the like, in addition to the HCOOH gas.

Next, in the step of FIG. 8C, the second step of FIG. 3F is conducted to the surface of the Cu—Mn alloy layer 26 from which the oxide film is removed, and with this, the Cu layer 27a is formed. As a result, the Cu film 27a is formed on the Cu—Mn alloy layer 26.

Further, the structure of FIG. 9C is transported to the plating processing apparatus through the air, and the Cu layer 17 is formed by a plating process (not shown) similar to that of the step of FIG. 5C.

With the present embodiment, the oxide layer formed on the Cu-M alloy layer 16 is removed chemically in the step of FIG. 9B, and thus, it is possible to decrease the electric resistance of the Cu layer 27 effectively by conducting the thermal annealing process of FIG. 3H after the plating processing.

After the step of FIG. 9C, the same process to the process of FIGS. 3H and 3I is carried out. The description thereof will therefore be omitted.

It should be noted that, with the present embodiment, the transportation of the substrate from the step of FIG. 9A to the step of FIG. 9B can be conducted also through the air. Further, the process of FIG. 9A and the process of FIG. 9B may be conducted in the same film forming apparatus such as a sputtering apparatus.

In the present embodiment, it is also possible to use the Cu—Mn alloy layer 26 as a seed layer without forming the Cu film 27a and form the Cu layer 27 by the electroplating process after the processing by the HCOOH gas.

Sixth Embodiment

FIG. 10 is a diagram showing the construction of a semiconductor device 40 having a Cu multilayer interconnection structure formed according to the process of the present invention.

Referring to FIG. 10, the semiconductor device 40 is formed on a device region 41A defined in a silicon substrate 41 by a device isolation structure 41B and includes a gate electrode 43 formed on the silicon substrate 41 via a gate insulation film and a pair of diffusion regions 41a and 41b formed in the substrate 41 at respective sides of the gate electrode 43.

The gate electrode 43 has sidewall surfaces covered with sidewall insulation films 43a and 43b respectively, and an interlayer insulation film 44 of a CVD-SiO$_2$ film or a low-K organic insulation film of the composition of SiOC or SiOCH is formed on the silicon substrate 41 so as to cover the gate electrode 43 and the sidewall insulation films 43a and 43b. Further, in the silicon substrate 41, there are formed source and drain diffusion regions 41c and 41d in the device region 41A at respective outer sides of the sidewall insulation films 43a and 43b.

On the interlayer insulation film 44, there is formed a similar low-K organic interlayer insulation film 45 and Cu interconnection patterns 45A and 45B are embedded in the interlayer insulation film 45. Each of the Cu interconnection patterns 45A and 45B is embedded in the interlayer insulation film 45 via a diffusion barrier film 45a or 45b of a continuous film of the composition of MnSixOy or MnxOy formed by the process of any of the previous embodiments with a thickness of 2-3 nm and is connected to the diffusion region 41c or 41d via a contact plug 44P or 44Q of tungsten (W) formed in the interlayer insulation film 44.

The Cu interconnection patterns 45A and 45B are covered with another low-K organic insulation film 46 formed on the interlayer insulation film 45, and a further low-K organic insulation film 47 is formed on the interlayer insulation film 46.

In the illustrated example, Cu interconnection patterns 46A-46C are embedded in the interlayer insulation film 46 and the Cu interconnection patterns 47A and 47B are embedded in the interlayer insulation film 47 respectively via similar diffusion barrier films 46a-46c and 47a-47b, wherein the interconnection patterns 46A and 46C are connected to the interconnection patterns 45A and 45B respectively via via-plugs 46P and 46Q, while the interconnection patterns 47A and 47B are connected to the interconnection patterns 46A and 46C respectively via via-plugs 47P and 47Q.

In the illustrated example, the via-plugs 46P and 46Q are formed integrally with the Cu interconnection pattern 46A and the Cu interconnection pattern 46B by a dual damascene process, respectively. Similarly, the via-plugs 47P and 47Q are formed integrally with the Cu interconnection pattern 47A and the interconnection pattern 47B by a dual damascene process, respectively.

According to the present invention, it becomes possible to form an extremely thin diffusion barrier film continuously for each Cu interconnection pattern by a self-forming reaction or self-organizing reaction characterized by self-limiting effect, concurrently to the formation of the seed layer. Thus, it is possible to secure low interconnection resistance and contact resistance even when the interconnection pattern is miniaturized. Further, the need of forming a barrier metal film by a separate process is no longer necessary, and the fabrication process of the semiconductor device is simplified.

It should be noted that the Cu—Mn alloy layer 16 or 26 may contain one or more other elements in addition to Cu and Mn in each of the embodiments described heretofore.

According to these embodiments, formation of Mn oxide over the surface of the Cu—Mn alloy layer is suppressed as a result of covering the surface of the Cu—Mn alloy layer with the first Cu layer immediately after formation of the Cu—Mn layer, or by transporting the substrate formed with the Cu—Mn alloy layer in a vacuum environment, or by terminating the surface of the Cu—Mn alloy layer with hydrogen. Further, according to these embodiments, the process of removing excessive Mn atoms by the diffusion through the first and second Cu layers is promoted at the time of filling the via-hole or interconnection trench with the second Cu layer formed on the first Cu layer by conducting re-sputtering of the Mn oxide formed on the surface of the Cu—Mn alloy or exposure of the surface of the Cu—Mn alloy layer to the reactive gas before the formation of the first Cu layer. With this, it becomes possible to form an interconnection pattern of low resistance by way of damascene process.

While the present invention has been explained for preferred embodiments, the present invention is not limited to such specific embodiments and various variations and modifications may be made within the scope of the invention described in patent claims.

What is claimed is:

1. A method for fabricating a semiconductor device, comprising:
    forming an opening defined by an inner wall surface in an insulation film;
    covering said inner wall surface with a Cu—Mn alloy layer;
    depositing a first Cu layer over said Cu—Mn alloy layer without exposing said Cu—Mn alloy layer to the air;
    depositing a second Cu layer over said first Cu layer and filling said opening with said second Cu layer; and
    forming a barrier layer over said inner wall surface as a result of a reaction between Mn in said Cu—Mn alloy layer and said insulation film.

2. The method as claimed in claim 1, further comprising, after forming said Cu—Mn alloy layer but before depositing said first Cu layer, re-sputtering a surface of said Cu—Mn alloy layer.

3. The method as claimed in claim 1, wherein said vacuum environment has a pressure of $10^{-7}$ Pa or less.

4. The method as claimed in claim 1, wherein said Cu—Mn alloy layer is formed by a sputtering process, said first Cu layer is formed by a sputtering process, and said second Cu layer is formed by an electrolytic plating process.

5. The method as claimed in claim 1, wherein said first Cu layer is formed with a thickness of 3-10 nm.

6. A method for fabricating a semiconductor device, comprising:
    forming an opening defined by an inner wall surface in an insulation film;
    covering said inner wall surface with a Cu—Mn alloy layer;
    terminating a surface of said Cu—Mn alloy layer with hydrogen;
    depositing a Cu layer over said Cu—Mn alloy layer and filling g said opening with said Cu layer; and
    forming a barrier layer over said inner wall surface as a result of a reaction between Mn in said Cu—Mn alloy layer and said insulation film.

7. The method as claimed in claim 6, wherein hydrogen termination is conducted by carrying out a hydrogen plasma processing.

8. The method as claimed in claim 7, wherein said hydrogen plasma processing is conducted at a temperature of 100-150° C.

9. A method for fabricating a semiconductor device, comprising:

forming an opening defined by an inner wall surface in an insulation film;

covering said inner wall surface with a Cu—Mn alloy layer;

depositing a Cu layer over said Cu—Mn alloy layer; and forming a barrier layer over said inner wall surface as a result of a reaction between Mn in said Cu—Mn alloy layer and said insulation film, wherein said method further comprises, after forming said Cu—Mn alloy layer before depositing said Cu layer, exposing a surface of said Cu—Mn alloy layer to a gas that forms a gaseous reaction product when reacted with a Mn oxide, or re-sputtering a surface of said Cu—Mn alloy layer.

10. The method as claimed in claim 9, wherein exposing to said gas that forms said gaseous reaction product upon said Mn oxide is conducted at a temperature of 100-400° C.

11. The method as claimed in claim 9, wherein forming said barrier layer is conducted while exposing to an ambient that forms a gaseous reaction product upon reaction with Mn.

12. The method as claimed in claim 10, wherein said gas forming said gaseous reaction product upon reaction with Mn or Mn oxide is a gas containing at least one of formic acid, carboxylic acid, hexafluoroacetylacetonate, $H_2O$ and $CO_2$.

* * * * *